United States Patent [19]

Hofmeister

[11] 3,997,100

[45] Dec. 14, 1976

[54] METHOD OF BEAM LEAD BONDING

[75] Inventor: Lucien A. Hofmeister, Mountain View, Calif.

[73] Assignee: Raytheon Company, Lexington, Mass.

[22] Filed: Jan. 13, 1975

[21] Appl. No.: 540,485

Related U.S. Application Data

[60] Continuation of Ser. No. 395,894, Sept. 10, 1973, abandoned, which is a division of Ser. No. 207,689, Dec. 13, 1971, abandoned, which is a continuation of Ser. No. 869,745, Oct. 27, 1969, abandoned.

[52] U.S. Cl. .............................. 228/179; 228/4.1; 29/577

[51] Int. Cl.² ...................................... B23K 19/04

[58] Field of Search .......... 228/115, 178, 179, 4.1, 228/5.1; 29/576 S, 577, 626, 628

[56] References Cited

UNITED STATES PATENTS

| | | | |
|---|---|---|---|
| 3,317,287 | 5/1967 | Caracciolo | 29/576 S |
| 3,505,726 | 4/1970 | Kleinedler et al. | 228/110 |
| 3,515,333 | 4/1971 | Kulicke et al. | 228/4.1 X |

*Primary Examiner*—Francis S. Husar
*Assistant Examiner*—Gus T. Hampilos
*Attorney, Agent, or Firm*—Richard M. Sharkansky; Joseph D. Pannone; Milton D. Bartlett

[57] ABSTRACT

An electrical circuit structure formed by bonding an integrated circuit, which has a plurality of conductive leads formed substantially coplanar with one surface of the semiconductor integrated circuit chip, to a pattern of conductive lines formed on the surface of a substrate having an insulating surface by positioning the leads adjacent the surface of the substrate supporting the conductive lines with portions of the conductive leads overlapping portions of the conductive lines and bonding said portions together by welding while exerting a substantially uniform weld deformation pressure on each of said conductive lead portions to deform said conductive lead portions to a predetermined degree.

9 Claims, 13 Drawing Figures

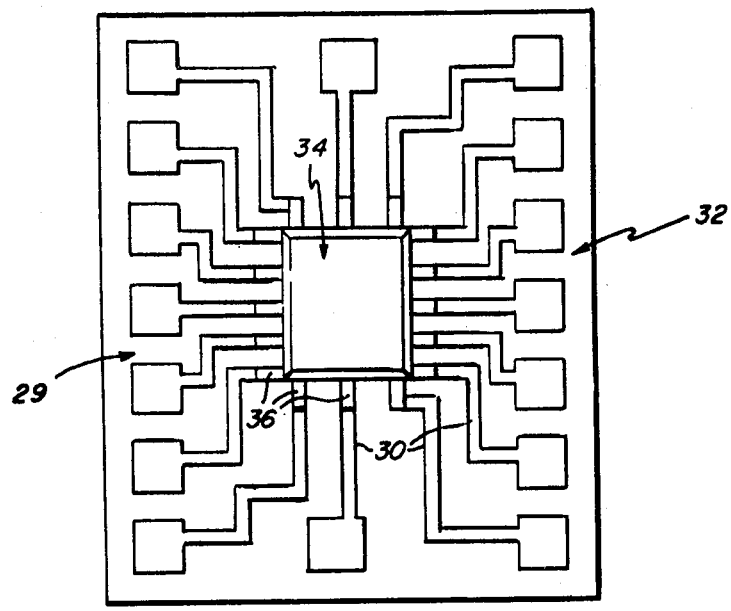
FIG. 2
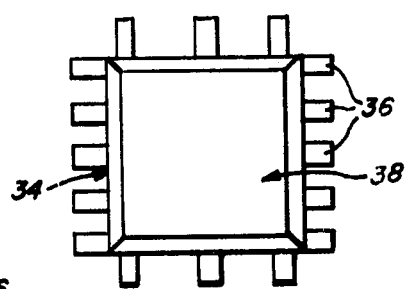
FIG. 3
FIG. 4

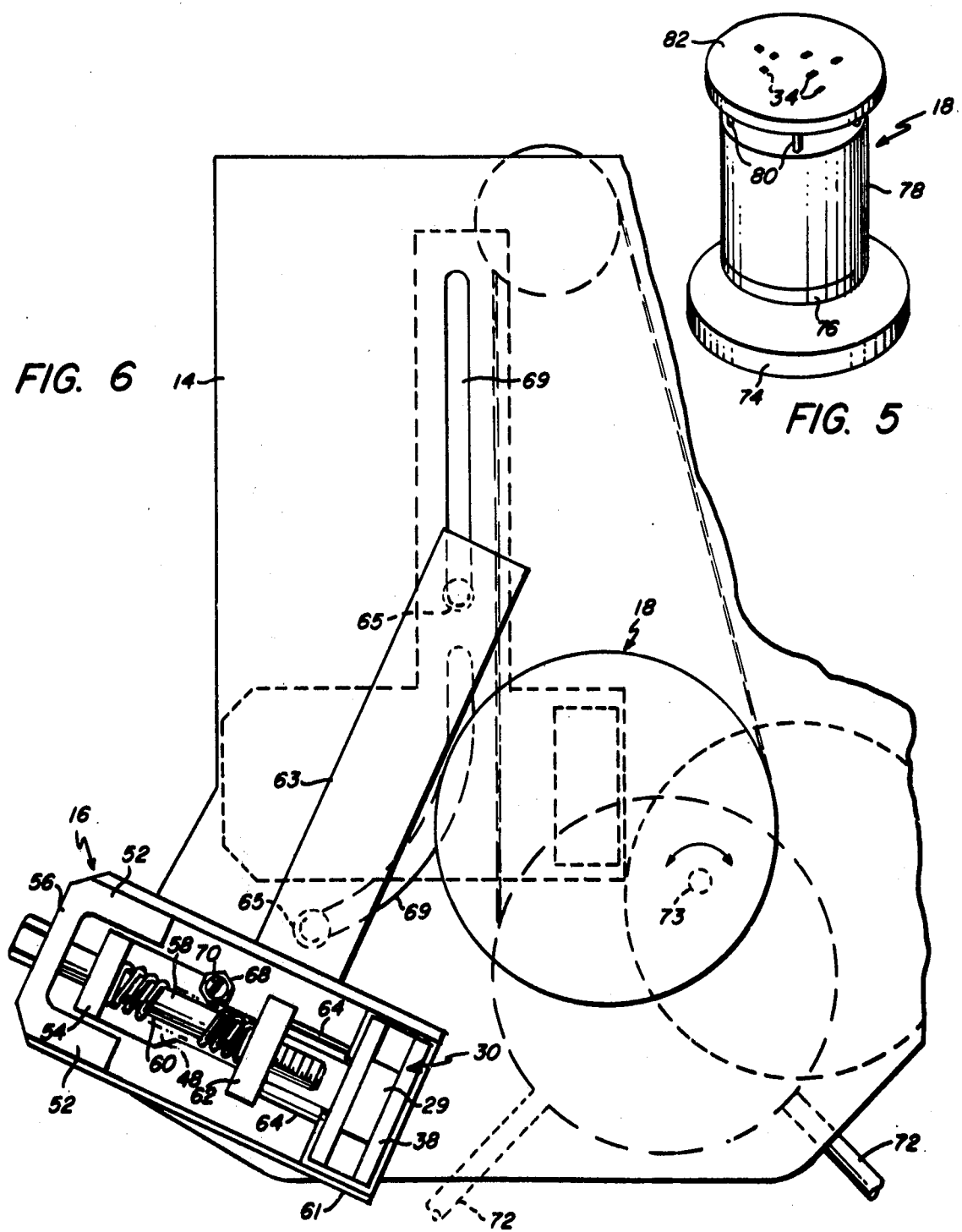

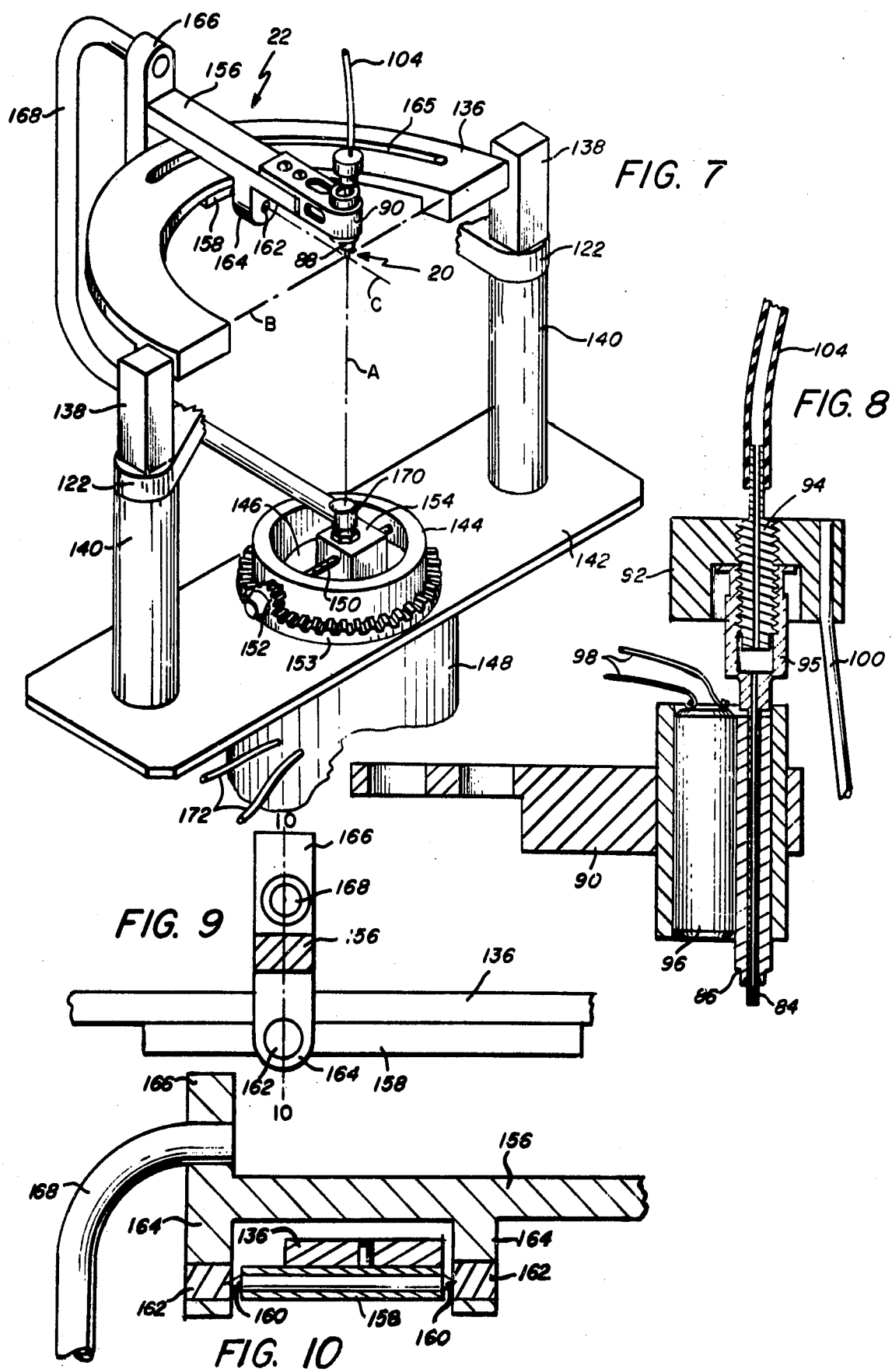

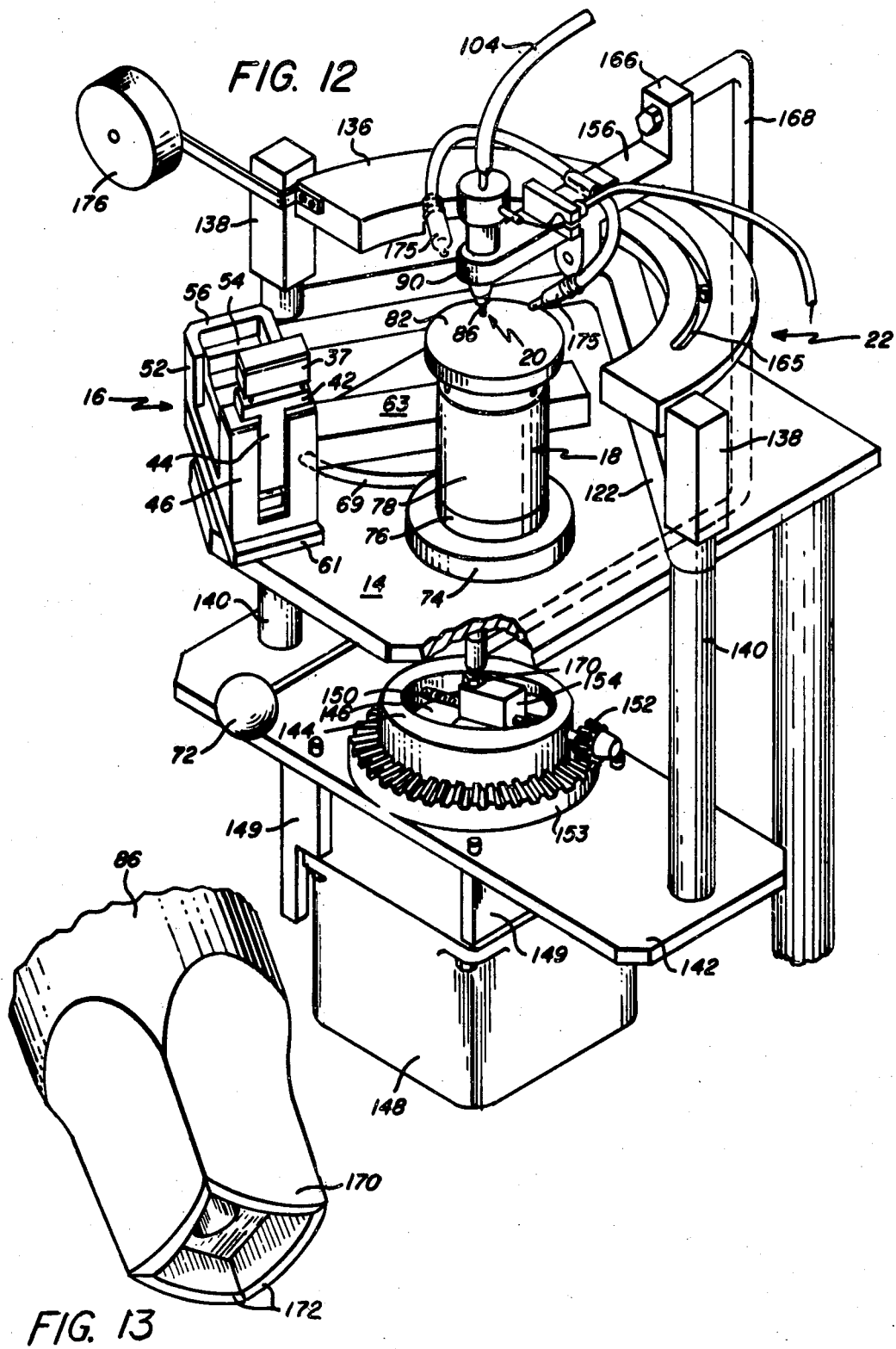

METHOD OF BEAN LEAD BONDING

CROSS REFERENCE TO RELATED APPLICATIONS

This is a continuation of application Ser. No. 395,894 (now abandoned) filed Sept. 10, 1973, which is a division of application Ser. No. 207,689 filed Dec. 13, 1971 abandoned), which is a continuation of application Ser. No. 869,745 filed Oct. 27, 1969 (now abandoned).

BACKGROUND OF THE INVENTION

In the semiconductor industry, one of the most undesirable processes relates to the means employed for connecting a microcircuit to an associated hybrid circuit device or substrate. For example, a substrate to which a microcircuit must be attached, may be a small single wafer with solder lugs or a large board with places for attaching several microcircuits and/or discrete devices. In either case, the substrate will comprise an insulated support or base with conductive lines applied in a suitable pattern. The lines or leads on the substrate may be applied by vapor deposition, silk screen printing, etching of unmasked metal coating, or other technique, and lead thicknesses will depend upon the method and controls employed in the lead formation process. It has been found that some methods are prone to sever variations in lead thickness.

In more recent state of the art, microcircuits of a type known as beam lead devices are constructed such that they can be packaged or laid directly into the circuits formed on the substrates. Prior to development of beam lead devices, conventional microcircuit devices had to be die attached and included a number of surface pads or terminals each of which had to be individually wire bonded to the respective portions of the substrate circuit. Beam lead devices, however, are provided with thin conductive tabs or leads which project outwardly from the edges of the device and which comprise the terminals which are to be attached to the hybrid circuit for both supporting the device and for electrically interconnecting portions of the device to respective leads on the hybrid circuit.

Bonding a microcircuit device, beam lead or otherwise, to a hybrid circuit by conventional methods and machines usually comprises using gold wire in conjunction with thermal-compression bonding techniques, each end of each wire being required to be separately bonded. This resulted in as many as 32 bonds for a 16-lead device, for example, with the additional processing steps associated with this type of bonding in order to make electrical and mechanical interconnections between the circuit element and the substrate pattern. Each such bond is a potential area of failure due to such mechanisms as misplaced bonds, shorting between bonds, and incomplete welds due to insufficient bonding pressure or too low bonding temperature. Likewise, failure of conventionally bonded devices also sometimes resulted from the use of long loops of gold wire which collapsed during highly accelerated motion, shorting the leads either to the device's patterns or to the substrate patterns. Failure also occurred when the wires sometimes shorted together.

Beam lead devices readily lend themselves to improved bonding techniques since the leads are themselves an integral part of the microcircuit element and provide not only electrical interconnection without separate wires but mechanical strength as well. All of the leads may be bonded in a single operation, are coplanar, and normally sufficient lead separation is inherently provided. In many cases, the microcircuit die is encapsulated in its own hermetic package, with only the leads or beams exposed.

Conventional bonding machines which perform simultaneous multiple bonds are not adapted to efficiently perform this function with beam leads or similar devices. Engagement of a bonding tool which is directed onto the bond area from a direction normal to the bond surface only will sometimes result in failure when sufficient compression is applied to effect pressure on all leads at once. This may be due to uncontrolled lateral flow of metal which occurs, especially when using leads of gold or other soft metal. The resultant deformation of the leads sometimes results in shorting between leads, or may result in complete severing of some leads.

Some bonding machines permit bonding on only one edge of a device at a time. Thus, this considerably lengthens the bonding time sequence. Other bonding machines do not efficiently bond several leads simultaneously when the leads are not truly coplanar, that is, when some leads have surfaces disposed at a higher or lower level than others. Bonding tools in the forms of wheels or discs cannot be employed to overcome this problem because of the miniscule sizes involved.

Some bonding machines having tools which rock, tilt or wobble partially overcome this problem. However, some problem of excessive transverse or sidewise flow of metal can still exist.

In some machines, specially designed optical systems are of necessity employed for use by the operators in aligning a microcircuit device with the circuit pattern on a substrate. Such optical devices employ partially reflecting surfaces so that a tool above a reflecting surface may be visually observed simultaneously with observation of a substrate or of a microcircuit through the reflecting surface. Such devices are sometimes difficult to use and lend to visual problems for an operator. efficient A flat-ended bonding tool cannot be utilized satisfactorily because of flatness tolerance, and if not specially configured, sometimes causes shearing of beam leads or tearing off of a lead.

SUMMARY OF THE INVENTION

This invention relates to a bonding machine which overcomes the above and other disadvantages of conventional bonding machines by the provision of a multiple bond which is effected in one operation by moving the tool into sequential bonding engagement with outer end portions of the beam leads in such a manner as to effect displacement or flow of metal in an outward direction away from the microcircuit die. This is achieved by imparting a spiral wobble motion to the tool. The means for accomplishing this includes a gimbal assembly for tool support.

The tool of the presently described machine has an open box-shaped or annular end which is either conically or spherically faced for effecting the pressure distribution desired upon the beam leads being bonded. Such tool configuration, coupled with the outward spiral wobble movement, effects efficient multiple bonding even when the lead surfaces are not disposed in a common plane. Furthermore, such means additionally effect sufficient bonding without shearing or tearing off the leads.

The present machine further includes means for rotatably supporting the die-carrying vacuum needle whereby improved alignment between die and hybrid circuit pattern is achieved.

BRIEF DESCRIPTION OF THE DRAWINGS

Other objects and advantages of this invention will become apparent from the following description taken in connection with the accompanying drawings, wherein:

FIG. 2 is a plan view, greatly enlarged, of a circuit device bonded with apparatus according to FIG. 1;

FIG. 3 is an enlarged plan view of a beam lead device such as may be bonded by the apparatus of FIG. 1;

FIG. 4 is an enlarged isometric view of the work-supporting device utilized in the apparaus of FIG. 1;

FIG. 5 is an isometric view of the pickup stage utilized in the apparatus of FIG. 1;

FIG. 6 is a plan view of the adjustable work table, work-supporting apparatus and pickup stage;

FIG. 7 is an isometric view of the tool-supporting and gimbal apparatus;

FIG. 8 is an enlarged vertical sectional view taken longitudinally through the tool-supporting mechanism;

FIG. 9 is a front elevational view partly in section illustrating the pivot structure for the tool-supporting mechanism;

FIG. 10 is a vertical sectional view taken substantially along line 10—10 of FIG. 9;

FIG. 12 is an isometric view of the gimbal-supporting apparatus, work- and tool- supporting mechanisms, pickup stage, and tool angling mechanism; and FIG. 13 is a greatly enlarged view of the bonding end portion of the tool.

DESCRIPTION OF THE PREFERRED EMBODIMENT

Figure 1:
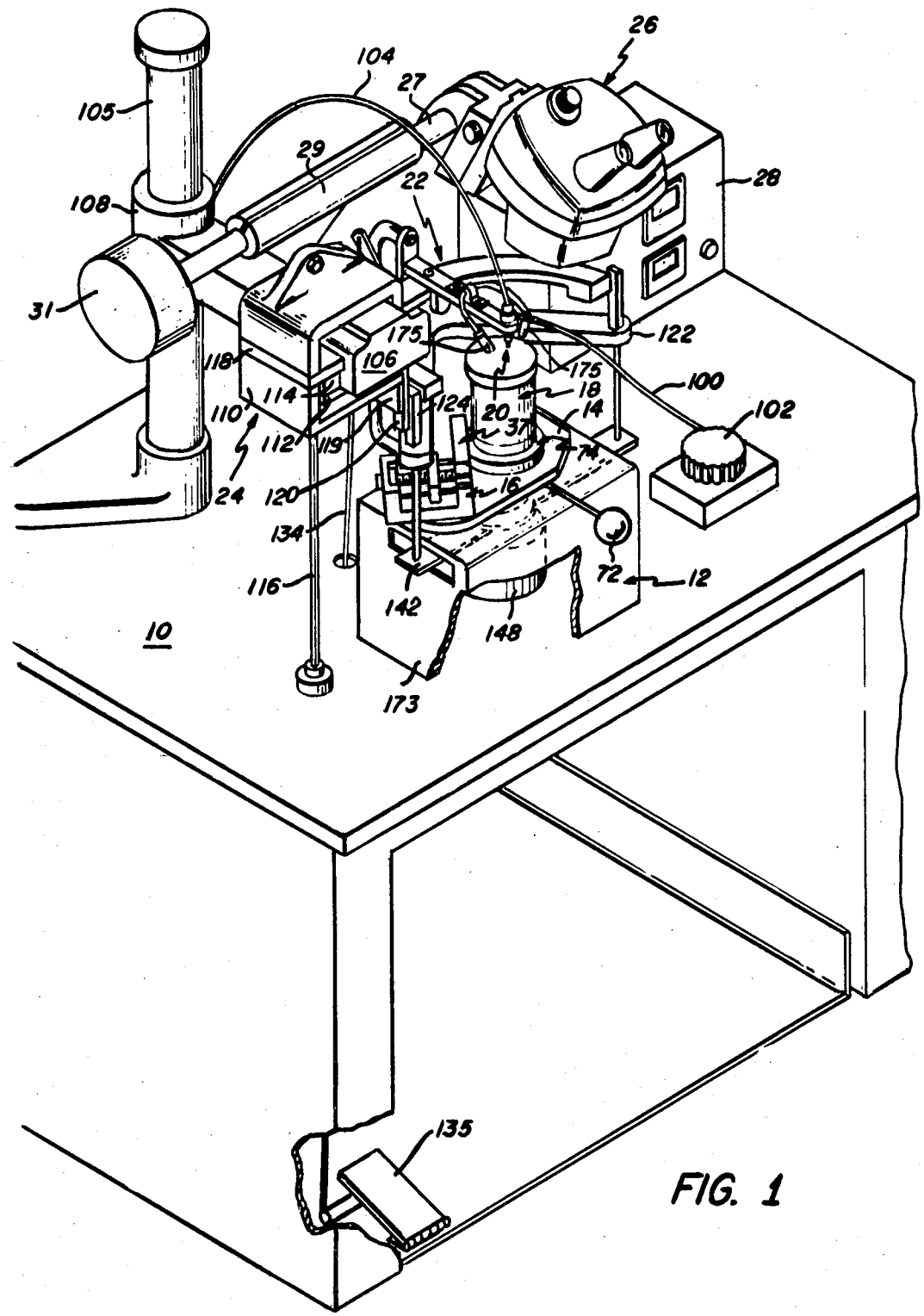
FIG. 1 is an isometric view of apparatus embodying the present invention.

Referring more particularly to the drawings wherein like characters of reference designate like parts throughout the several views, the bonding machine illustrated in FIG. 1 comprises several basic groups of cooperative parts, all combined into a single machine adapted to be mounted on a single support or table 10.

A housing 12 mounted on the table 10 encloses the control mechanism for moving the bonding tool and associated apparatus. Above housing 12 is a slide platform 14 whose upper surface carries the hybrid circuit-supporting apparatus or work stage 16, and the semiconductor device supporting apparatus or pickup stage 18. The bonding tool mounting apparatus 20 is adjustably supported in a gimbal mechanism 22 for movement in a prescribed manner toward and away from work on the supporting apparatus 16, as will be described. The gimbal mechanism 22 is further supported by apparatus 24 whereby it can be independently adjusted as desired, as will also be described. The gimbal supporting apparaus 24 includes additional means for simultaneously supporting optical means such as a stereo magnifier 26 which is adapted to be focused upon the work area. The magnifier or microscope 26 is mounted on one end of an arm or rod 27 which is slidably located within a supporting member 29 adjustably affixed to a frame 110 to be described hereinafter. A counterbalance 31 is adjustably mounted on the opposite end of the rod 27.

Electrical controls are adapted to be located nearby in a suitable housing 28, as shown.

The bonding machine herein disclosed will be described and illustrated in connection with bonding of beam lead semiconductor devices to selected hybrid circuits for use therewith. However, it should be understood that the present invention may be useful in bonding other types of devices, if desired.

To more clearly depict actual use of a bonding machine of the character described, there is shown enlarged in FIG. 2 an example of a substrate circuit device 29 with a beam lead device 34 set in place. The circuit is a suitable pattern of conductive lines 30 (preferably gold or the like) on an insulating flat substrate base 32, deposited thereon by vapor deposition, silk screen printing, etc., as is well known in the art.

An example of an encapsulated beam lead devices or die 34 by itself is shown in FIG. 3 in greatly enlarged form, which device is to be bonded to the substrate circuit device 29. Beam lead device 34 is an integrated or microcircuit formed in the well-known manner so as to have a plurality of terminals or leads 36 extending freely outwardly from the encapsulated package 34 as shown. Leads 36 are flat tabs formed of gold or the like and are arranged to match with the inner terminating ends of the lines 30 of circuit device 29. The microcircuit device 34 is placed upon the juncture area of circuit device 29 with the leads 36 overlying the inner ends of circuit lines 30 by a few thousandths of an inch. The overlapping areas of leads 36 and lines 30 are to be bonded together by either thermo-compression or ultrasonic bonding with the presently described machine.

In order to achieve such bonding, the machine operator places the circuit package or microcircuit board 29 in place on a work stage 37 (FIGS. 1 and 4). The work stage may, if desired, include a heater (not shown) for heating the hybrid circuit or microcircuit package 29, which package will be hereinafter referred to as a substrate package. The work stage 37 comprises a nesting block 38 which is mounted by thermal isolating pins 40 on the top of a support block 42. Block 42 has a downwardly extending portion 44 which extends between two uprights 46 and contacts through a ball at its lower end a horizontally disposed lever arm 48. Arm 48 is pivotally connected at 50 between a second pair of uprights 52 and has, above pivot 50, an upstanding arm 54. A back plate 56 carried by uprights 52 is spaced from arm 54 and has a headed, threaded shaft 58 extending through it and overlying lever arm 48. A spring 60 is mounted over shaft 58 and is held thereon by a nut 62 which has pins on rods 64 projecting rearwardly therefrom into holes in respective uprights 46 to prevent the nut from turning. The block 42 is also provided with rods 66 which extend down into respective uprights 46 whereby the block 42 may be guided vertically, together with the stage 37 and substrate package 29 thereon.

It will be apparent that the tension of spring 60 will constantly apply pressure upon arm 54, causing the free end of lever arm 48 to urge the arm portion 44 and the support 42 and stage 37 upwardly. By rotation of the head of shaft 58, the compression of the spring and, consequently, the pressure upon the support may be adjusted. Limitation of movement of the stage 37 in an upward direction is achieved by a collar 68 which bears upon the upper surface of lever arm 48 and is mounted upon a threaded shaft or rod 70 secured to the base of the device. The purpose of this spring loaded apparatus is to supply the pressure required in the bonding operation.

The entire work stage 16 is mounted by a movable base 61 on the platform 14. The base 61 has a rearwardly extending arm or slide 63 which carries pins 65 (FIG. 6) which engage within slots 69 provided therefor in the platform 14. Thus, the work stage 16 can be slid to the operating position shown in dotted outline in FIG. 6 from the loading position which is shown by full lines. The work stage 16 is itself adjustably secured to the base 61 as by the pin, collar and slot arrangement 71 shown in FIG. 4.

A deck 74 on platform 14 carries the pickup stage 18 and is rotatable about a vertical axis 73 (FIG. 6) in any suitable manner upon manual manipulation of a handle 72 (FIGS. 1 and 6) which thus enables either the pickup stage 18 with supply of beam lead devices thereon, or the work stage 16 with a substrate package 29 thereon, to be alternately so positioned and located in the working or operating position within an area under the tool assembly 20 and to be viewed through the binocular microscope 26.

After the work stage 37 has been located in the loading position and the substrate package 29 has been positioned in the nest on block 38 of the work stage, the operator places a supply of beam lead devices 34, oriented or otherwise, upon the pickup stage 18. Pickup stage 18 includes the magnetized metal deck, stand or base 74 (FIG. 5) which rests upon platform 14 and upon which is a pedestal 78 which is preferably, but not necessarily, made of light-weight material such as plastic, for example. Secured to the top of pedestal 78 as by resilient pads 80 is a glass disc 82 which may be a mirror for receiving thereon a supply of beam lead devices 34, the mirrored surface being the bottom surface of disc 82 whereby both the top and under sides of the beam lead devices may be optically viewed simultaneously in an oblique manner for orientation purposes.

By manipulation of handle 72 to rotate platform 14, the operator may move stage 18 into a position for viewing through microscope 26. The pedestal 78 and supporting disc 82 thereon may also be individually adjusted by hand by moving the pedestal about on the surface of deck 74. The pedestal may be properly adjusted to position a selected one of the beam lead devices beneath the bonding tool apparatus 20 which is shown in detail in FIGS. 7 and 8. Apparatus 20 includes a vacuum pickup needle 84 slidably mounted for vertical movement within a longitudinal bore in a bonding tool 86. Tool 86 is suitably removably mounted within an opening in a chuck 88 supported by a tool holding bar 90 which is, in turn, mounted on the gimbal apparatus 22 to be described hereinafter. Needle 84 is held in its lowermost position by a weight 92 having a threaded stud portion 94 threadedly inserted into the hollow upper end portion 95 of the needle 84, which end portion rests upon the adjacent upper end of the tool 86 when the needle is in this position. Also carried within the chuck 88 in physical contact with the tool 86 is a heater cartridge 96 to which a suitable source of electrical potential (not shown) is connected as by wires 98. Means such as a flexible cable 100 is connected at one end to weight 92 for the purpose of rotating the needle 84 about a vertical axis, this being manually accomplished by a knob 102 mounted on table 10 at one side of the machine as shown in FIG. 1.

The stud 94 in weight 92 is bored as shown in FIG. 8 and is provided with a hollow projection to which one end of a hose 104 is attached for connecting the needle to an external source of vacuum (not shown) as is well known in the art.

Figure 11:
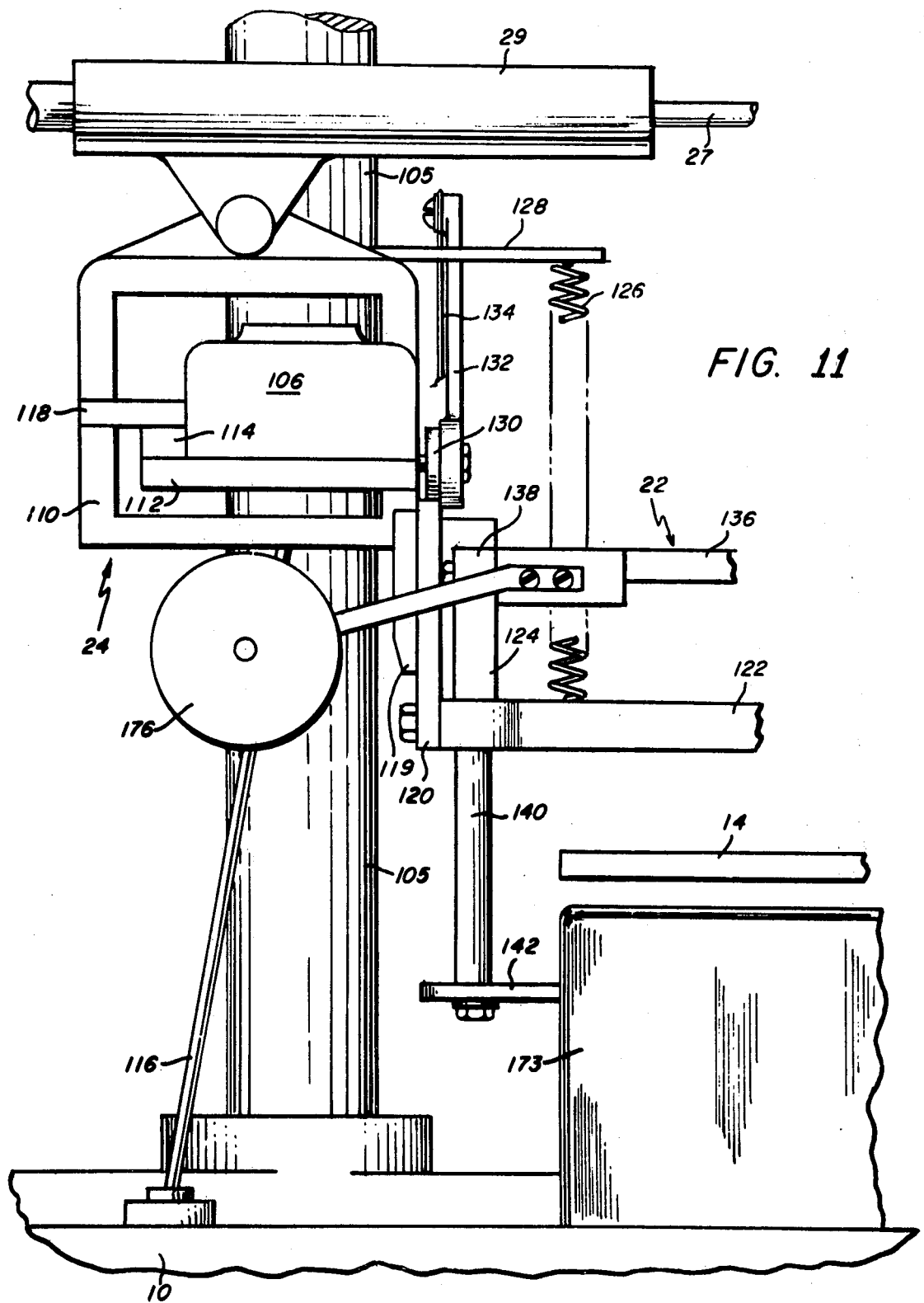
FIG. 11 is a front elevational view of the gimbal-supporting and adjustment apparatus.

As pointed out above, the tool holding apparatus 20 is supported upon the gimbal apparatus 22 which is in turn flexibly supported upon an upright post 105 fixed at its lower end to table 10 (FIGS. 1 and 11). The gimbal supporting apparatus 24 is a conventional structure and, therefore, will be only briefly described herein to the extend necessary for a complete understanding of the important aspects of this invention. It includes a forwardly directed supporting arm 106 which has one end portion 108 mounted upon post 105. Arm 106 is vertically adjustable on post 105 and may be fixedly held in adjusted position thereon in any well-known manner so as to position the gimbal apparatus 22 and consequently the tool supporting arrangement 20 at a desired height above the table 10.

Encircling the unsupported end of arm 106 is a hollow support frame 110 which carries a lateral slideway 112 which slidably rides on a cooperating slideway 114 fixed to arm 106. Connected to the slideways by suitable bearings (not shown) is a pendant joy stick 116 by which adjustment of the frame 110 laterally along arm 106 may be manually accomplished. Frame 110 also carries a second transverse slideway 118 which cooperates with the upper surface of slideway 114 on arm 106. Manual operation of joy stick 116 thus also may produce motion of the frame 110 transversely of arm 106. Thus, universal motion of frame 110 in a single horizontal plane is achieved.

To one side of frame 110 is a vertical slideway 119 (FIG. 11) to which is slidably attached a cooperating slideway 120 which carries the gimbal apparatus 22, which gimbal apparatus 22 includes a horizontally extending support bar 122 having an upright end portion 124 on which slideway 120 is mounted. The gimbal apparatus is constantly urged upwardly by a spring 126 which is attached at one end to bar 122 and at its other end to a bracket 128 carried by frame 110. However, to lower the gimbal apparatus to the extent permitted by slideways 119 and 120, a cam 130 and lever 132 are rotatably attached to the side of frame 110, the cam 130 bearing upon the upper end of slideway 120. The free end of lever 132 has connected to it one end of a wire or cable 134 which is attached at its other end to suitable motion imparting means such as a foot pedal 135 (FIG. 1) beneath the table or bench 10. Thus, by depressing the foot pedal, an operator will cause rotation of lever 132 and with it cam 130, the cam being shaped so that, when rotated, a high point thereon will force the slideway 120 downwardly against the tension of spring 126, thus lowering the entire gimbal apparatus 22, including the tool supporting apparatus 20. Upon release of the foot pedal, spring 126 will automatically raise the gimbal apparatus to its previous position.

Gimbal apparatus 22, in addition to support arm 122, includes a rocker plate 136 (FIGS. 7 and 12) which is arcuate in shape and which is pivotally mounted at its ends to posts 138 which extend upwardly from support arm 122. The pivot points about which rocker plate 136 rotate lie in a plane through the end of tool 86 and form an axis B about which the plate 136 rocks. Two additional posts 140 extend downwardly from support arm 122 and are secured near respective end portions of a support plate 142. Upon plate 142 is a hollow cylinder 144 to the bottom 146 of which is fixed one end of a vertically extending motor drive shaft (not shown). The shaft extends through plate 142 from a motor 148 which is mounted in any suitable manner to the under side of plate 142 as by brackets 149. When electrically activated, motor 148 causes rotation of cylinder 144. Extending diametrically through cylinder 144 is a threaded shaft 150 which is rotatably supported by diametrically opposed wall portions of the cylinder, with one end of the shaft protruding through the wall and carrying thereon a pinion gear 152. Gear 152 meshes with a ring gear 153 which encircles cylinder 144 and is fixed to plate 142. Thus, rotation of cylinder 144 by motor 148 will cause rotation of pinion gear 152 and, consequently, of shaft 150. Nut 154, threaded onto shaft 150, revolves with cylinder 144 and shaft 150 in an arc about the vertical axis of the cylinder. However, the nut 154 will describe a changing arc as it rotates, which arc will be of a size dependent upon the position of the nut on the shaft 150. Thus, if nut 154 happens to be located near an end of the shaft, it will move in an arc of larger radius than it would if located near the center of the cylinder, midway of the length of the shaft. Through several turns of cylinder 144, the nut 154 may be seen to course a spiral path.

This movement of the nut 154 controls the "wobble" of the tool, as will be described. The tool 86 is tied to the nut 154 through the tool supporting apparatus 20 which is described in connection with FIGS. 7–10. Apparatus 20 includes tool holding bar 90 which is pivotally secured to the rocker plate 136 by a rocker arm 156, to which it is bolted or otherwise attached, and a pivot plate 158 (FIGS. 9 and 10). The pivot plate 158 is attached to the under side of rocker plate 136 by screws or the like and supports the rocker arm 156 by means of opposed pivots 160 on the front and rear sides of plate 158, which pivots engage bearings 162 mounted in downwardly extending arms 164 projecting from rocker arm 156. The pivot plate 158 is secured to rocker plate 136 by screws or the like which extend through a slot 165 (FIG. 7) in plate 136, whereby the plate 158 and rocker arm 156 may be adjusted about a vertical axis passing through tool 86.

Extending rearwardly and downwardly from an upstanding arm 166 on rocker arm 156 is a connecting rod 168 which has a forwardly directed bottom portion terminating in a universal ball joint connection 170 by which it is connected to nut 154 (FIGS. 7 and 12). It is important to note that connection 170 is located near one side of nut 154 so as to permit maximum radial movement of the connection during operation of the device; that is, location of connection 170 near one end of the nut 154 thus permits the connection to assume a position near one wall of cylinder 144, as well as allowing connection 170 to assume an on-axis position or to be located at any point therebetween.

It will be understood, then, that operation of motor 148 will cause movement of the nut through an arc about the vertical axis A of cylinder 144, as has been described. However, due to the threaded engagement of nut 154 with shaft 150, the nut will simultaneously and progressively move lengthwise of the shaft, thus increasing or decreasing its spatial relationship with respect to the axis A of the cylinder 144, and in a direction depending on clockwise or counterclockwise motion of the motor. From this, it will be apparent that the connecting rod will create a "wobble" in the tool 86.

The lower end of tool 86 will stay aligned with the crossing point between axis C and the horizontal axis B through the rocker plate pivot points, but the upper end thereof will be wobbled through a spiral path, the size of the spiral being controlled by the movement of the nut 154 along shaft 150. The lower end of tool 86 will always point at the connection 170 along axis A even as axis A is varying "wobble angle" from true vertical.

Motor 148 is connected to a suitable source of current by circuitry 172 which will include necessary switches and the like for starting, stopping and reversing the motor at the required times. A suitable casing 173 is provided on the table 10 for housing motor 148.

A weight 176 (FIG. 12) may be employed to counterbalance the off-center weight of gimbal 22 and the apparatus it supports.

The positioning of a selected beam lead device 34 on the selected substrate package 29 is accomplished by observing the devices 34 on the pickup stage 18 through the microscope 26 and moving the stage as required to position the selected one of the devices directly beneath the tip of the tool 86. To assist in this operation there are provided one or more lamps 175 which are suitably mounted upon rocker arm 156 so as to properly direct illumination upon the work area in the field of view through the microscope 26.

The end of the tool 86, which has an open square-sided configuration and the hollow needle 84 projecting down therefrom, are moved downwardly into engagement with the selected device 34. This is done by depressing foot pedal 135, pulling down cable 134 and lever arm 132, causing the cam surface on cam 130 to urge the gimbal apparatus 22 and tool supporting apparatus 20 downwardly against the resistance of spring 126.

As the tool 86 moves toward the device 34 to be picked up, the hollow needle 84 will first contact the device. Air suction within the needle 84 will cause the device to adhere to the end of the needle, whereupon the foot pedal 135 may be released to allow the spring 126 to return the gimbal apparatus to its uppermost position. This will raise the tool supporting apparatus 20 well above the pickup stage.

At this point, the platform 74 is manually rotated to its aside position and the work stage 16 is slid to the right and to the rear into bonding position where the circuit substrate 29 thereon will be located beneath the tool. With substrate 29 properly located on work stage 37, the central portion of the substrate to which the beam lead device is to be attached will be positioned directly beneath the lower end of the tool 86. Again foot pedal 135 is operated to lower the gimbal apparatus 22, tool supporting apparatus 20 and tool 86, together with the needle 84 and device thereon, to place the beam lead device 34 slightly above the surface of the substrate 29. The needle 84 may now be rotated by manipulation of knob 102 to properly axially align the beam leads 36 on device 34 with the bonding pads or portions of the circuit leads 30 on the substrate 29, and simultaneously the joy stick 116 is used for lateral and transverse alignment.

At this point the tool 86 is fully lowered, and controlled pressure is applied to the beam leads 36 together with heat from the tool and/or sonic vibration of the tool to bond the beam leads to the circuit leads 30. The needle 84, now entirely within the tool 86, maintains a small pressure on the leads 36 due to the weight 92.

The leads may be individually bonded, bonded a side at a time, or simultaneously bonded. However, in accordance with the present invention, they are bonded individually and successively by novel means to be described. In the present example, we shall concern ourselves with thermo-compression bonding, although sonic techniques may be employed or a combination of techniques.

In thermo-compression bonding, heat is imparted to the tool 86 by applying energy through wires 98 to the heater cartridge 96 which transfers heat directly to the tool. To effect bonding, the heated tool 86 is pressed down, by the operation of the mechanism described hereinbefore, in such a manner as to cause a squeezing together of the matching areas to be joined. An extrusion or flowing of metal occurs and molecules of both elements intermingle as a result of the combined heat and pressure. The cyclic nature of the tool motion actually creates a series of bonds in outward direction on each of the tab and line bond pairs.

Normally, in the process, permanent deformation of the elements takes place and the dimensions of the elements as joined are changed considerably from their original values. The stacked height of the two elements will be considerably reduced, by as much as 25-30%, and the metal that has been displaced will be found to have caused a movement of surrounding metal, thus resulting in increases in lateral dimensions of the elements. Since the base leads, that is the circuit leads 30 on the substrate device 29, are firmly a part of the substrate, less metal flow occurs in those areas. Therefore, the greater deformation will occur in the beam lead device tabs 36 assuming, of course, that the metal employed is of the same density, etc. From this, it will be apparent that if most of the thinning-out of metal cross-section occurs in the upper or beam lead tabs 36, and assuming the tabs 36 and leads 30 were of similar thickness, a reduction of 25% in total stack height could mean nearly 50% reduction in beam lead tab thickness.

In accordance with this invention, the tool 86 is a hollow pencil- or tube-like structure having an arc of curvature at its end as seen in FIG. 13. Tool 86 is hollow, as shown, to allow the pickup needle 84 to slide up and down within it as previously described. The extreme lower end of the tool has an open end square-sided boxlike configuration 170 as shown in FIG. 13. The lower end or face 172 of each side of the tool is provided with a convex bowing as shown. The face 172 is the tool surface which contacts the tabs 36. Thus, the tool 86 can fit over the body of a beam lead device 38 (FIG. 2) to be bonded, with the body of the device 38 extending freely into the cavity within the end of the tool. The tool 86 then may be rocked or wobbled to move each end surface 172 over the tabs 36 on a corresponding side of the device 38, rising and lowering as necessary to accommodate various tab heights.

The rocking motion is achieved by the combined actions of the gimbal apparatus or mechanism 22 as it rocks about the horizontal axis B and of the tool supporting rocker arm 156 as it rocks about the axis C of pivots 152. In this type of operation, the centermost tabs on the sides of device 38 are bonded first when the tool 86 is brought into vertical contact with these tabs. Then, the remaining tabs towards the corners of the device are sequentially and successively bonded as the spiral wobble is effected, whereupon the tool ends up back at its starting point, when it is lifted away from the attached device. It should be noted here that the edges 172 of the tool bonding faces should also preferably be rounded in the transverse direction so that no relatively sharp corners exist which may cut into, shear or tear the tabs.

Such a circular wobble motion as described in the foregoing paragraph is relatively easy to obtain and adjust.

In further accordance with the present invention, the tool 86 not only is angled and moved to sequentially bond the tabs 36 throughout the periphery of a beam lead device as described, but it is also moved in a spiral manner so as to pass over and bond each tab a number of times in a progressively outward direction. That is, the tool is moved first through a relatively small radius to first bond each tab relatively closely to the device body, and then the movement of the tool continues in a continuously widening spiral so as to cause each tab 36 to be contacted and bonded in an area outwardly from the first bond. The tool may be moved through two, three or more revolutions, as desired. Each tab 36 will thus be bonded in two or more spots or areas in progressive steps outwardly. Such outward bonding thus tends to compress each tab in such a manner that flow of the material of the tabs will occur primarily in an outward direction longitudinally of the respective tabs.

This spiral bonding path is achieved by virtue of the fact that the tool angle is constantly changed by movement of the nut 154 (FIG. 7) along the threaded shaft 150, as described hereinbefore, the end of the tool thus being adjusted with respect to vertical axis A as the cylinder 144 is rotated and the nut consequently moved.

The motor 48 may be operated upon actuation of a suitable switch (not shown) in the well known manner, and other switching means may be provided for stopping the motor when the tool has been moved through a suitably lengthy path. The motor will then reverse so as to return the tool to its starting inoperative position, preferably after the tool 86 has been lifted from the work area.

From the foregoing it will be apparent that all of the objectives of this invention have been achieved by the apparatus shown and described. It will be apparent, however, that certain modifications may be made by those skilled in the art without departing from the spirit of the appended claims. It is intended, therefore, that all matter shown and described be interpreted as illustrative and not in a limiting sense.

I claim:

1. The method of forming an electrical circuit structure comprising the steps of:
    forming an integrated circuit comprising a solid body of semiconductor material having a plurality of interconnected semiconductor elements and a plurality of deformable conductive leads connected to at least some of said elements and having regions extending outwardly from said body substantially parallel to a surface of said body and beyond the edges thereof;
    positioning said regions of said deformable leads adjacent to regions of a plurality of conductive lines bonded to insulating regions of a solid support substrate, with said semiconductor body being supported on said substrate through said conductive leads; and repetitively deforming, to form deformations, and bonding a plurality of each of said regions of each of said leads to said lines throughout a substantial extent of said regions of said leads and said lines in a time sequence in which the points of maximum deformation of said deformations are sequentially produced and spaced along the longitudinal axes of said leads.

2. The method in accordance with claim 1 wherein said deformable leads are formed substantially coplanar with a substantially planar surface of said semiconductor body.

3. The method in accordance with claim 2 wherein said step of forming said integrated circuit comprises forming said leads on said body and electrically connecting through an insulating layer on said body to active semiconductor elements formed in said body.

4. The method in accordance with claim 3 wherein said conductive lines have surfaces extending substantially coplanar with surfaces of said deformable leads.

5. The method in accordance with claim 1 wherein each of said leads is bonded to said lines in a time sequence in which said leads are bonded successively to form one bonding cycle and each of said leads is further deformed in each of a plurality of successive bonding cycles.

6. The method in accordance with claim 5 wherein successive regions of bonding and deformation overlap previously deformed regions.

7. The method in accordance with claim 1 wherein bonding pressure is exerted between said deformable leads and said lines by means of a hollow tool surrounding said semiconductor body during said bonding process.

8. The method in accordance with claim 3 wherein the axis of said tool forms an acute angle with respect to a line perpendicular to a plane containing said bonding regions and said axis of said tool is rotated with respect to said body about said perpendicular line during said bonding process.

9. The method in accordance with claim 7 wherein said angle is shifted during rotation of said axis.

* * * * *

UNITED STATES PATENT OFFICE
CERTIFICATE OF CORRECTION

Patent No. 3,997,100          Dated December 14, 1976

Inventor(s) Lucien A. Hofmeister

It is certified that error appears in the above-identified patent and that said Letters Patent are hereby corrected as shown below:

Column 4, line 51, delete "on" and insert therefor -- or --;

Column 6, line 10, delete "extend" and insert therefor -- extent --;

Column 8, line 6, after "is" insert -- in --;

Column 9, line 62, delete "152" and insert therefor -- 162 --.

*Signed and Sealed this*

*Twenty-second* Day of *November 1977*

[SEAL]

Attest:

RUTH C. MASON      LUTRELLE F. PARKER
*Attesting Officer*      *Acting Commissioner of Patents and Trademarks*